US012666898B2

(12) United States Patent
Spyropoulos et al.

(10) Patent No.: US 12,666,898 B2
(45) Date of Patent: Jun. 23, 2026

(54) GAS BOX WITH CROSS-FLOW EXHAUST SYSTEM

(71) Applicant: Lam Research Corporation, Fremont, CA (US)

(72) Inventors: Evangelos T. Spyropoulos, San Jose, CA (US); Iqbal A. Shareef, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 761 days.

(21) Appl. No.: 18/002,619

(22) PCT Filed: Nov. 15, 2021

(86) PCT No.: PCT/US2021/059405
§ 371 (c)(1),
(2) Date: Dec. 20, 2022

(87) PCT Pub. No.: WO2022/108880
PCT Pub. Date: May 27, 2022

(65) Prior Publication Data
US 2023/0238253 A1 Jul. 27, 2023

Related U.S. Application Data

(60) Provisional application No. 63/198,857, filed on Nov. 17, 2020.

(51) Int. Cl.
*H10P 72/00* (2026.01)
*C23C 16/44* (2006.01)
*C23C 16/455* (2006.01)

(52) U.S. Cl.
CPC ...... *H10P 72/0402* (2026.01); *C23C 16/4412* (2013.01); *C23C 16/45561* (2013.01)

(58) Field of Classification Search
CPC .............. C23C 16/4412; C23C 16/455; C23C 16/4556; H01L 21/67017; H01J 37/32853
See application file for complete search history.

(56) References Cited

U.S. PATENT DOCUMENTS 6,076,543 A 6/2000 Johnson
7,907,402 B2 * 3/2011 Caveney ............ H05K 7/20572
312/236

(Continued)

FOREIGN PATENT DOCUMENTS

JP 2020098854 A 6/2020
WO WO-2020214616 A1 10/2020

OTHER PUBLICATIONS

Ebay Listing: "Lam Research P/N 846-077848-858 Jetstream OPT/ MSTGi Gas Box", Web Address: https://www.ebay.com/itm/ 173586358959 , published on Nov. 13, 2020, pp. 1-7.

(Continued)

*Primary Examiner* — Steven S Anderson, II
(74) *Attorney, Agent, or Firm* — Weaver Austin Villeneuve & Sampson LLP

(57) ABSTRACT

Gas boxes for providing semiconductor processing gases are provided that incorporate a cross-flow ventilation system that may effectively remove potentially leaking gases from within the gas box at significantly lower volumetric flow rates than are possible with conventional gas box ventilation systems.

20 Claims, 10 Drawing Sheets

(56)            References Cited

U.S. PATENT DOCUMENTS

| 2002/0011268 | A1* | 1/2002 | Cho ................. | C23C 16/45561 |
| | | | | 137/377 |
| 2003/0136446 | A1 | 7/2003 | Young | |
| 2005/0248043 | A1* | 11/2005 | Bettridge ................. | F24F 9/00 |
| | | | | 261/27 |
| 2009/0061755 | A1* | 3/2009 | Calder ............... | H05K 7/20736 |
| | | | | 361/692 |
| 2012/0058630 | A1* | 3/2012 | Quinn ................ | C23C 16/4412 |
| | | | | 427/255.39 |

OTHER PUBLICATIONS

International Preliminary Report on Patentability dated Jun. 1, 2023, in Application No. PCT/US2021/059405.
International Search Report and Written Opinion dated Mar. 14, 2022, in Application No. PCT/US2021/059405.
KR Office Action dated Aug. 18, 2025 in KR Application No. 10-2022-7045809, with English Translation.

* cited by examiner

100

112

102

104

GAS BOX WITH CROSS-FLOW EXHAUST SYSTEM

RELATED APPLICATION(S)

A PCT Request Form is filed concurrently with this specification as part of the present application. Each application that the present application claims benefit of or priority to as identified in the concurrently filed PCT Request Form is incorporated by reference herein in its entirety and for all purposes.

BACKGROUND

Semiconductor processing tools commonly include one or more semiconductor processing chambers that provide an isolated environment within which to process semiconductor wafers. During semiconductor processing operations, various semiconductor processing gases may be introduced into the semiconductor processing chamber(s) and flowed across a wafer or wafers being processed. Different semiconductor processing gases (also referred to herein as simply "gases") may be flowed into a semiconductor processing chamber at different times, at different flow rates, and for different durations depending on the requirements of a particular semiconductor processing operation.

The control and supply of the various gases used by a semiconductor processing tool is usually provided by a "gas box" or similar assembly. A gas box typically features a plurality of "gas sticks" or similar gas flow component assemblies that may include a number of gas flow control components, e.g., one or more valves, mass flow controllers, flow restrictors, pressure regulators, and/or releasable fittings that are configured to provide for precise control of fluidic flows responsive to commands from a controller, e.g., a semiconductor processing tool controller. Gas boxes may also, in some instances, provide for control of non-gaseous fluids, e.g., liquids; reference to "gas boxes" herein is understood to refer to both gas-only gas boxes as well as to gas boxes that may also provide for liquid delivery to a semiconductor processing chamber.

Gas boxes are typically enclosed in a housing and have an exhaust port or ports that are connected with an exhaust system that draws air from the gas box and directs it through a scrubber system that may be used to remove or render harmless any potentially harmful gases or vapors that may have leaked from the gas flow components within the gas box. Such gases or vapors may include materials that are corrosive, poisonous, and/or flammable/explosive.

SUMMARY

Details of one or more implementations of the subject matter described in this specification are set forth in the accompanying drawings and the description below. Other features, aspects, and advantages will become apparent from the description, the drawings, and the claims.

Due to the number of different gases that may be used in some newer or under-development semiconductor processing tools, some gas boxes may include 15 to 20, or even potentially more, gas flow component assemblies in a given gas box.

The present inventors realized in existing gas boxes, extremely high exhaust flow rates were required in order to ensure that any potential leakage of gases from the gas flow components housed therein would be promptly evacuated from the gas box and not be given an opportunity to, for example, come into contact with certain components within the gas box. For example, such flow rates may help ensure that gases that are flammable, e.g., hydrogen, are prevented from coming into contact with (or, more correctly, are prevented from reaching potentially unsafe concentrations around) potential ignition sources, e.g., electrical connectors. In some gas box systems, for example, flow rates of ~60 cfm may need to be used in order to drive sufficient air flow through the gas box to ensure that any potentially leaking gas cannot reach unsafe concentrations within certain regions of the gas box.

The present inventors realized that such flow rates may present particular challenges in some circumstances—for example, in many semiconductor processing facilities, multiple semiconductor processing tools, e.g., 20-40 semiconductor processing tools, may have gas box exhaust systems that direct exhaust gas (and any potentially leaked fluids) to a common scrubber system. If each gas box exhaust system is operating at too high a flow rate, e.g., 60 cfm, the total amount of air that may need to be processed by such a scrubber system each minute may be quite high, e.g., 1800 to 3600 cubic feet per minute.

Other issues with the use of high flow rates are increased energy consumption needed to power more powerful exhaust blowers and increase noise resulting from higher flow velocities.

To address such issues, the present inventors designed an improved gas box that implements certain features that permit such gas boxes to provide for adequate gas removal at significantly lower flow speeds, e.g., flow speeds that are ~40% of those seen in 60 cfm systems. This significantly lowers scrubbing requirements, allowing for the use of smaller, less expensive scrubbers and/or allowing for a single scrubber to treat exhaust gas from larger numbers of semiconductor processing chambers, e.g., 1.5× more, than can be supported by that scrubber at the higher flow rate.

Such gas boxes may include a housing that encloses an interior volume and a plurality of first gas flow component assemblies located within the interior volume. The plurality of first gas flow component assemblies may generally be arranged along a first axis. The housing may have a first side with one or more inlet holes, a second side with one or more exhaust openings, and a third side that is substantially parallel to the first axis and generally interposed between the first side and the second side. The third side may have a plurality of cross-flow holes generally arranged along a second axis that is substantially parallel to the first axis, and the one or more inlet holes, the one or more exhaust openings, and the plurality of cross-flow holes may be configured such that when a) a negative pressure differential exists between the one or more exhaust openings and the one or more inlet holes and b) the one or more inlet holes and the plurality of cross-flow holes are fluidically connected with air, at least a first portion of the air is drawn from the one or more inlet holes, through the housing, and to the one or more exhaust openings in directions predominantly aligned with the first axis, and at least a second portion of the air is drawn from the plurality of cross-flow holes, past the first gas flow component assemblies and in a direction generally transverse to the first axis, and then to the one or more exhaust openings.

As indicated above, when such a gas box is connected with an exhaust system such that a vacuum is drawn on the one or more exhaust openings of the gas box, the negative pressure differential that develops between the one or more exhaust openings and the one or more inlet holes (which may be in direct fluidic communication with the ambient environment around the gas box) may cause a first flow of ambient air to be drawn in through the one or more inlet holes, through the gas box in a direction generally parallel with the first axis, and out through the one or more exhaust openings. At the same time, a second flow of ambient air may also be caused to flow into the gas box through the cross-flow ports by the same negative pressure differential. The second flow of ambient air into the gas box through the cross-flow ports may initially generally be in a direction perpendicular to the third side, thereby allowing the second flow of ambient air to push potentially leaked gases that may be trapped or eddying in stagnant air that may exist between the first flow of ambient air and the third side into the first flow of ambient air, thereby allowing such leaked gases to be efficiently evacuated by the first flow of ambient air.

In some implementations, a gas box for a semiconductor processing apparatus is provided. The gas box may include a housing enclosing an interior volume and a plurality of first gas flow component assemblies located within the interior volume. The plurality of first gas flow component assemblies may be generally arranged along a first axis, and the housing may have a first side with one or more inlet holes and a second side with one or more exhaust openings, as well as a third side that is substantially parallel to the first axis and generally interposed between the first side and the second side. The third side may have a plurality of cross-flow holes generally arranged along a second axis that is substantially parallel to the first axis, and the one or more inlet holes, the one or more exhaust openings, and the plurality of cross-flow holes may be configured such that when a) a negative pressure differential exists between the one or more exhaust openings and the one or more inlet holes and b) the one or more inlet holes and the plurality of cross-flow holes are fluidically connected with air, at least a first portion of the air is drawn from the one or more inlet holes, through the housing, and to the one or more exhaust openings in directions predominantly aligned with the first axis, and at least a second portion of the air is drawn from the plurality of cross-flow holes, past the first gas flow component assemblies and in a direction generally transverse to the first axis, and then to the one or more exhaust openings.

In some implementations, the first gas flow component assemblies of each adjacent pair of one or more adjacent pairs of the first gas flow component assemblies may have at least one corresponding cross-flow hole of the cross-flow holes interposed therebetween when viewed along a direction perpendicular to the third side.

In some implementations, the first gas flow component assemblies of each adjacent pair of the first gas flow component assemblies may have at least one corresponding cross-flow hole of the cross-flow holes interposed therebetween when viewed along a direction perpendicular to the third side.

In some implementations, each of one or more of the first gas flow component assemblies may have a portion thereof that overlaps with at least one corresponding cross-flow hole of the cross-flow holes when viewed along a direction perpendicular to the third side.

In some implementations, each of the first gas flow component assemblies may have a portion thereof that overlaps with at least one of the cross-flow holes when viewed along a direction perpendicular to the third side.

In some such implementations, each first gas flow component assembly may include a corresponding first gas flow component, second gas flow component, and first releasable fluidic fitting, and the first gas flow component of each first gas flow component assembly may be fluidically interposed between the second gas flow component of that first gas flow component assembly and the first releasable fluidic fitting of that first gas flow component assembly.

In some such implementations, for each first gas flow component assembly of one or more of the first gas flow component assemblies, the cross-flow hole that is closest thereto may be at a location interposed between the first gas flow component of that first gas flow component assembly and an end of the first releasable fluidic fitting of that first gas flow component assembly that is furthest from that first gas flow component when viewed from a direction perpendicular to the third side.

In some such implementations, for at least one or more of the first gas flow component assemblies, the first gas flow component may be a valve and the second gas flow component is a mass flow controller.

In some such implementations, there may be at least two of the first gas flow component assemblies in which the first gas flow component is a valve and the second gas flow components is a mass flow controller, and for each of the first gas flow component assemblies, the first gas flow component may be a valve and the second gas flow component may be a mass flow controller.

In some implementations, the first gas flow component and the second gas flow component of each of the first gas flow component assemblies may be, respectively, a valve and a mass flow controller.

In some such implementations, the mass flow controllers may be, at least in part, spaced apart from the third side such that a gap is formed between at least part of each mass flow controller and the third side.

In some such implementations, at least one of the one or more inlet holes may be positioned so as to overlap, at least in part, with the gap when viewed along the first axis.

In some implementations, the gas box may be configured such that each cross-flow hole is positioned so as to be in a location that appears, when viewed along a direction perpendicular to the third side, to be proximate to a releasable fluidic connection that is configured to conduct gas at a supra-atmospheric pressure during normal operation of the gas box.

In some implementations, the one or more inlet holes may have a total cross-sectional area of X, the cross-flow holes have a total cross-sectional area of Y, and X is between 4 and 5 times Y.

In some implementations, the one or more inlet holes may have a total cross-sectional area of X, the cross-flow holes have a total cross-sectional area of Y, the one or more exhaust openings have a total cross-sectional area of Z, and any other fluidic flow paths into or out of the gas box, when the gas box is closed and in a normal operational state and other than the one or more inlet holes, the cross-flow holes, and the one or more exhaust openings, have a total cross-sectional area of less than 20% of X+Y.

In some implementations, the other fluidic flow paths into or out of the gas box, when the gas box is closed and in a normal operational state and other than the one or more inlet holes, the cross-flow holes, and the one or more exhaust openings, may have a total cross-sectional area of less than 10% of X+Y.

The above-listed implementations are only some of the implementations that will be apparent from the description provided herein and the accompanying drawings, and are not intended to be considered an exclusive list of implementations that will be evident from the discussion herein.

It will be appreciated that the Figures discussed herein are merely intended to provide a reference for discussion and are not intended to limit the present disclosure. Other implementations not specifically depicted herein but evident from the totality of the disclosure are also intended to be within the scope of the disclosure.

DETAILED DESCRIPTION

As discussed earlier, the present inventors designed an improved gas box that implements certain features that permit such gas boxes to provide for adequate gas removal at significantly lower flow speeds, e.g., flow speeds that are approximately 40% of those seen in 60 cfm systems. This significantly lowers scrubbing requirements, allowing for the use of smaller, less expensive scrubbers and/or allowing for a single scrubber to treat exhaust gas from larger numbers of semiconductor processing chambers, e.g., 1.5× more, than can be supported by that scrubber at higher flow rates typically needed for conventional gas boxes.

The SEMI S6 standard that governs the minimum performance requirements that are considered to be acceptable/safe for semiconductor manufacturing equipment exhaust ventilation specifies, among other parameters, that gas boxes be designed with ventilation systems that are designed such that concentrations of flammable gas in the vicinity of potential ignition sources (such as electrical connections) not exceed one quarter of their lower explosive limit (LEL) even when a leak of 2000 sccm for such a gas occurs.

The LEL is the lowest concentration of a flammable gas or vapor that will burn in air when ignited by an ignition source. In evaluating such leak rate scenarios, hydrogen is usually assumed to be the leaking gas since the LEL for hydrogen is approximately 4%, which is the lowest LEL of the gases that would normally be flowed through the gas box. Hydrogen is also the smallest gas, molecularly, and would thus have the highest leak rate of any gases used in a semiconductor processing tool under identical environmental conditions. If a gas box system is able to meet the designated threshold of one quarter of the hydrogen LEL threshold of 4%, i.e., 1%, then the gas box system would meet the ¼ LEL requirement for any of the gases that would be potentially flowed into such a gas box system.

Existing gas box systems, due to their design, typically operate at high flow rates due to their ventilation design in order to meet the ¼ LEL requirement. For example, as discussed above, such gas boxes may require as much as 60 cfm of air flow to be drawn through them in order to generate air flow throughout the box that is sufficient to ensure that any potentially leaked gases are evacuated before being able to reach the SEMI S6 limit.

Figure 1:
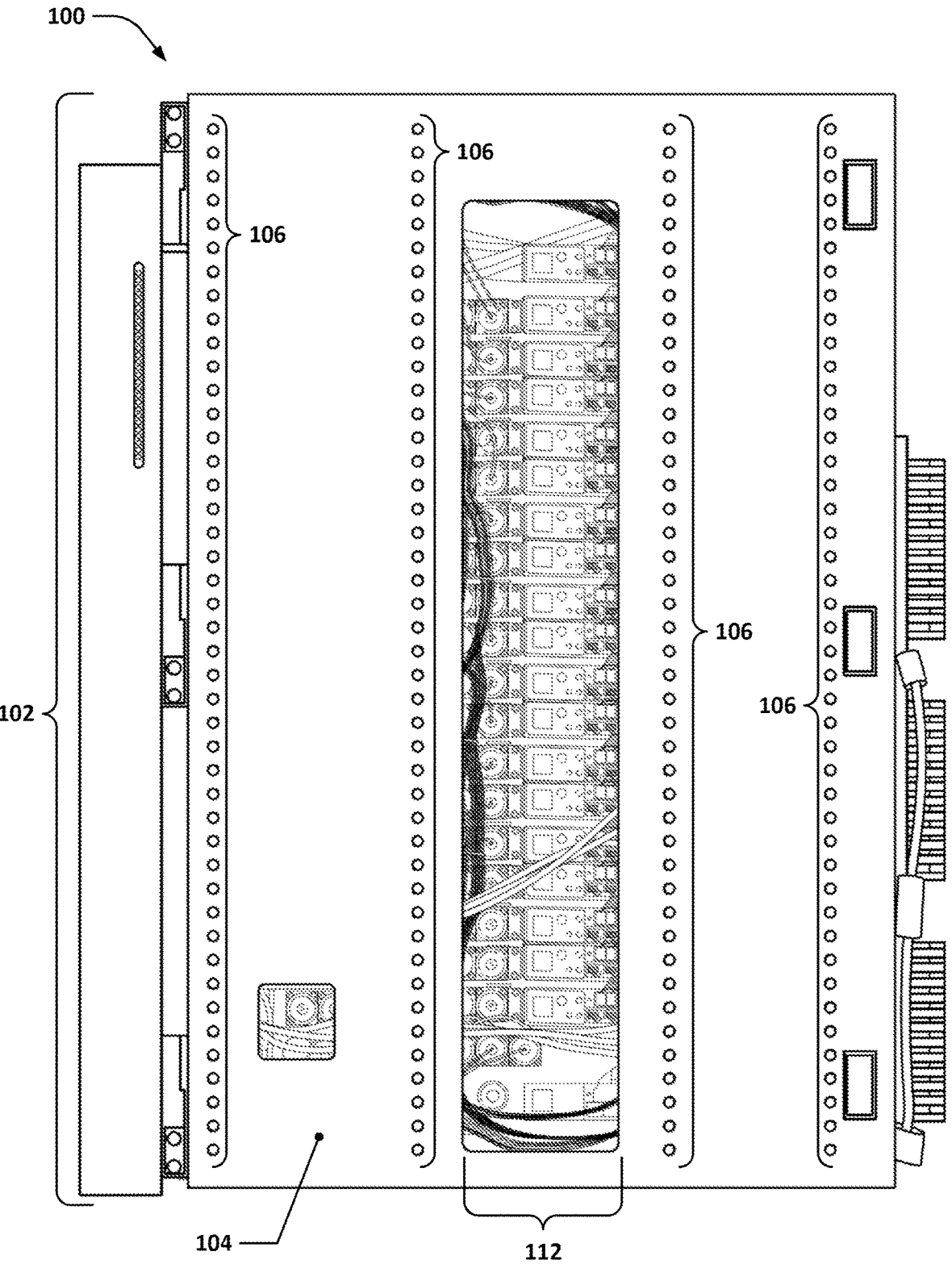
FIG. 1 depicts a sketch of a conventional gas box.

To provide context, FIG. 1 depicts a sketch of a conventional gas box 100. The gas box 100 may have a door 104 that may be opened to access an interior volume that houses a plurality of gas flow components 112 (partially visible through a transparent window in the door 104). As can be seen, the door 104 may have several vertical, linear arrays of door vent holes 106 arranged across it from right to left.

Figure 2:
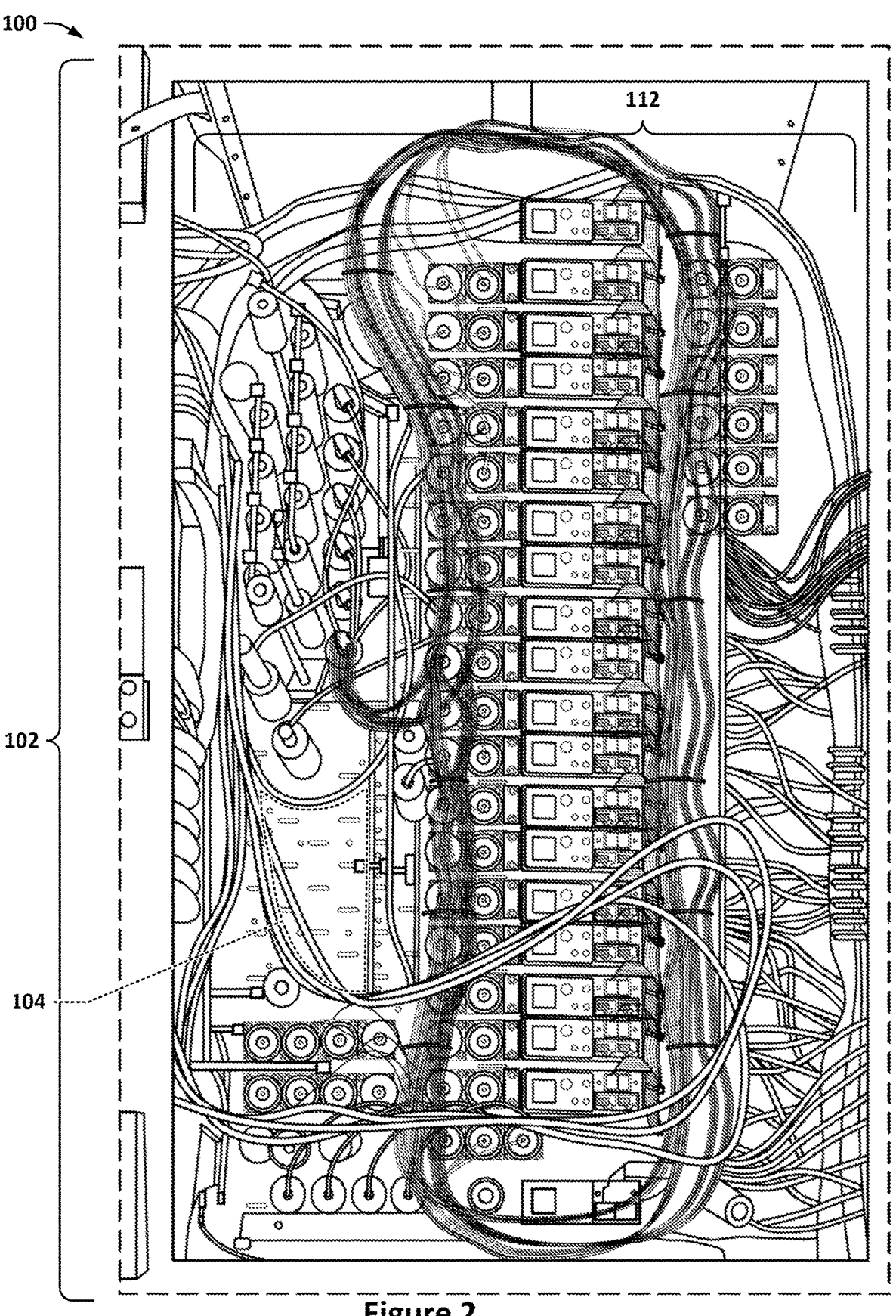
FIG. 2 depicts a sketch of the interior of the conventional gas box of FIG. 1 with the door of the gas box of FIG. 1 open.
Figure 3:
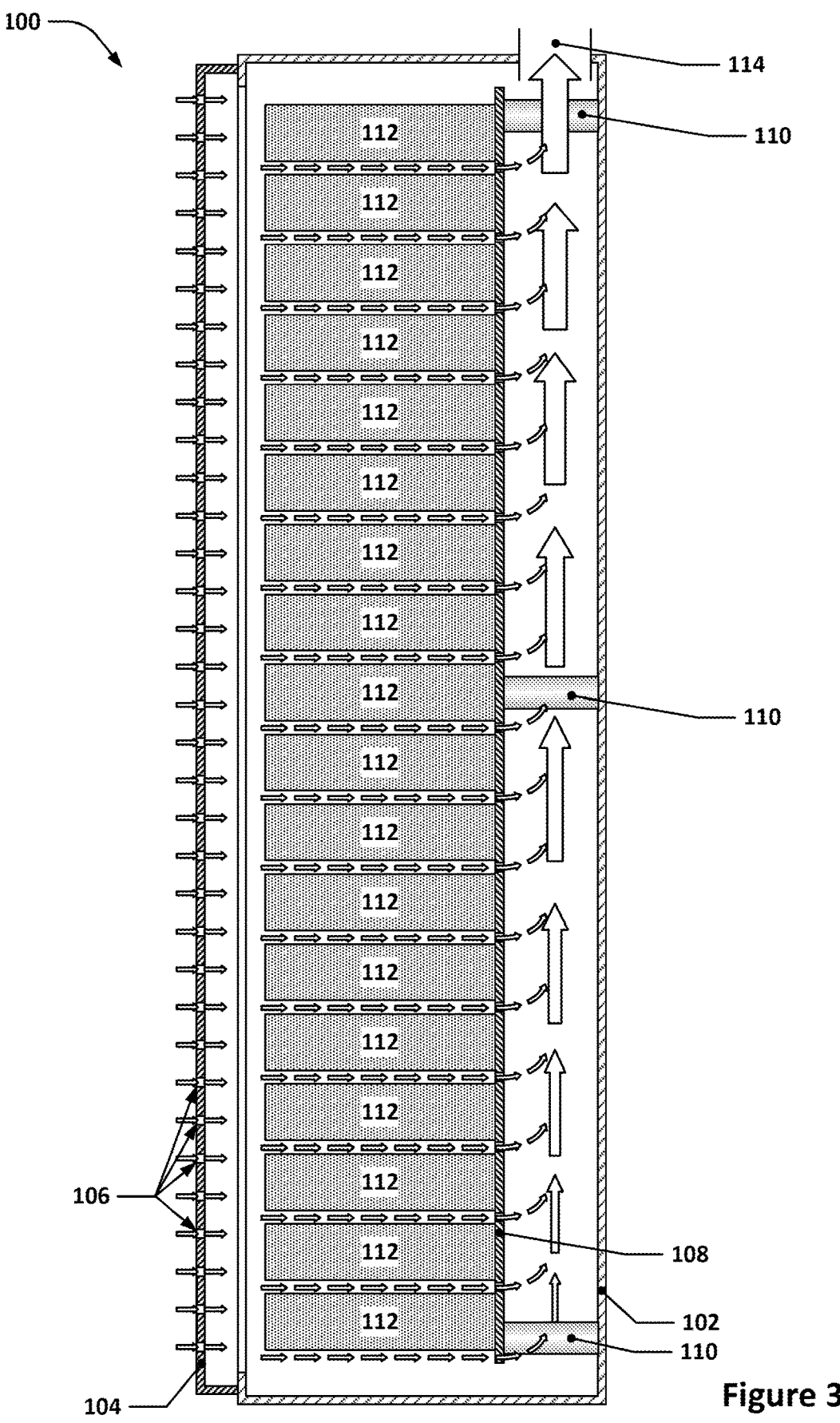
FIG. 3 is a side view schematic of a conventional gas box similar to that of FIG. 1.

As can be seen from FIG. 2, which shows the interior of the gas box 100 with the door 104 open, the internal gas flow components 112 of such a gas box 100 may be packed very close together with very little clearance between many of the components. In the gas box 100 of FIGS. 1 and 2, the gas flow components 112 may be mounted to a perforated mounting plate 108 that is elevated from the surface of the housing beneath it by a plurality of standoffs 110, as shown in FIG. 3. The use of the perforated mounting plate 108 allows for the gas flow components 112 to be mounted to the perforated mounting plate 108 while the perforated mounting plate 108 is removed from the housing 102, thereby simplifying the assembly of the gas flow components 112 to the perforated mounting plate 108. The entire assembly of the perforated mounting plate 108 and the gas flow components 112 mounted thereto may then be installed as a unit within the housing 102, there by simplifying the assembly process while, at the same time, establishing a plenum space behind the perforated mounting plate 108 that allows for the negative pressure region to be developed behind the perforated mounting plate 108 to draw air from the door vent holes 106 and past the gas flow components 112.

During use, as shown in FIG. 3, air may be drawn from the gas box 100 through an exhaust vent 114 located in the top of the gas box 100. The exhaust vent 114 may be positioned in between the perforated mounting plate 108 and a back wall of the gas box 100. When air is drawn from the gas box 100 via the exhaust vent 114, a low-pressure region may be produced in the plenum space between the perforated mounting plate 108 and the back wall of the housing 102. As a result of this low-pressure region, air may be drawn from the portion of the gas box in which the gas flow components 112 are mounted, through the perforated mounting plate 108, and into the plenum space behind the perforated mounting plate 108 before being drawn out through the exhaust vent 114. Correspondingly, the low pressure that is generated in the space where the gas flow components 112 are located may cause ambient air from outside the housing 102 to be drawn in through the door vent holes 106.

The present inventors realized that this arrangement required undesirably high air flow rates be maintained in order to achieve the ¼ LEL requirement discussed earlier. For example, in order to achieve the ¼ LEL requirement discussed above, such gas boxes 100 would likely need to maintain air flow rates of 60 cfm. Since the air flow through such gas boxes 100 generally forces all of the air to flow through a relatively constricted flow path, e.g., through the door vent holes 106, past the wiring, tubing, and gas flow components 112 that are supported by the perforated mounting plate 108, and then through the perforated mounting plate 108 before flowing through the plenum space in between the perforated mounting plate 108 and the back wall of the housing 102, the pressure drop that is observed may, for example, be on the order of –0.3" of water (~–75 Pa). The present inventors also realized that such an arrangement tended to bias flow towards the end of the door 104 that was closest to the exhaust vent 414, with less and less fluid flow occurring the further one moved from the exhaust vent 414, as represented by the decreasingly smaller vertical arrows representing air flow through the plenum space in FIG. 3.

The present inventors realized that by modifying the configuration of a gas box's ventilation features, a drastic reduction in flow resistance (and thus a decreased pressure drop) could be achieved for air flow through the gas box. This, in turn, allowed for much lower volumetric air flow rates to be used while still meeting the ¼ LEL requirement discussed earlier.

In particular, instead of using a gas box architecture in which ambient air was sucked into the gas box entirely, or nearly entirely, through the door of the gas box through a regular array of door vent holes, as was the case with the example of FIGS. 1 through 3, the present inventors designed a gas box in which inlet holes were strategically positioned at locations arranged on a side of the gas box opposite from the side of the gas box in which the exhaust opening (or openings) was provided. Such positioning ensured that the air that entered through such inlet holes would need to traverse the entire length of the gas box in order to reach the exhaust opening(s), thereby reducing instances in which portions of the interior volume of the gas box might see stagnant air flow. At the same time, the inlet holes were, instead of simply being arranged in a regular geometric patterns, e.g., similar to the door vent holes 106 of FIGS. 1 through 3, strategically positioned, in many cases, to align with high-conductance flow paths in between/past the internal gas flow components of the gas box when viewed from a direction generally perpendicular to the side of the gas box with the inlet holes.

As a result of such placement, the air flow that develops from the inlet holes to the exhaust opening(s) is generally unobstructed or only somewhat obstructed, allowing such air flow to generally transit the housing in a generally laminar manner, e.g., as a nominally free stream flow, with only a slight pressure drop, e.g., <0.1" of water (~25 Pa) pressure drop. In particular, if the gas box features a linear array of gas flow components in it, as is the case with the gas box 100 of FIGS. 1 through 3, the linear array may be arranged along a first axis that is generally aligned with the air flow that develops between the inlet holes to the exhaust opening(s). This may cause a natural "tunnel" to be formed within the housing that may serve as a high-conductance passageway for air to flow through from the inlet holes to the exhaust opening(s).

At the same time, the present inventors realized that including additional ambient air inlets in the form of cross-flow holes strategically positioned along one or more surfaces that are generally parallel to the first axis could act to introduce cross-flows of air that would disrupt potential stagnation points that might develop in potentially dangerous areas within the gas box. In particular, the present inventors determined that, for example, including such cross-flow holes in the vicinity of potential leak points would potentially cause any potential leaked gas to be swept into the free stream flow that is provided by gas flowing from the inlet holes to the exhaust opening(s), thereby causing the leaked gas to be carried to the exhaust opening(s) and evacuated from the gas box.

By selectively targeting where such cross-flow holes and inlet holes were located, the total number of such holes (and their total cross-sectional area) may be kept relatively low (as compared with simply providing regularly distributed holes that are not necessarily each strategically located near a potential stagnation point and/or leak source), thereby reducing the amount of air that must be drawn through the gas box in order to achieve the desired amount of air flow within the gas box.

Such concepts are discussed in more detail below with reference to FIGS. 4 through 9.

Figure 4:
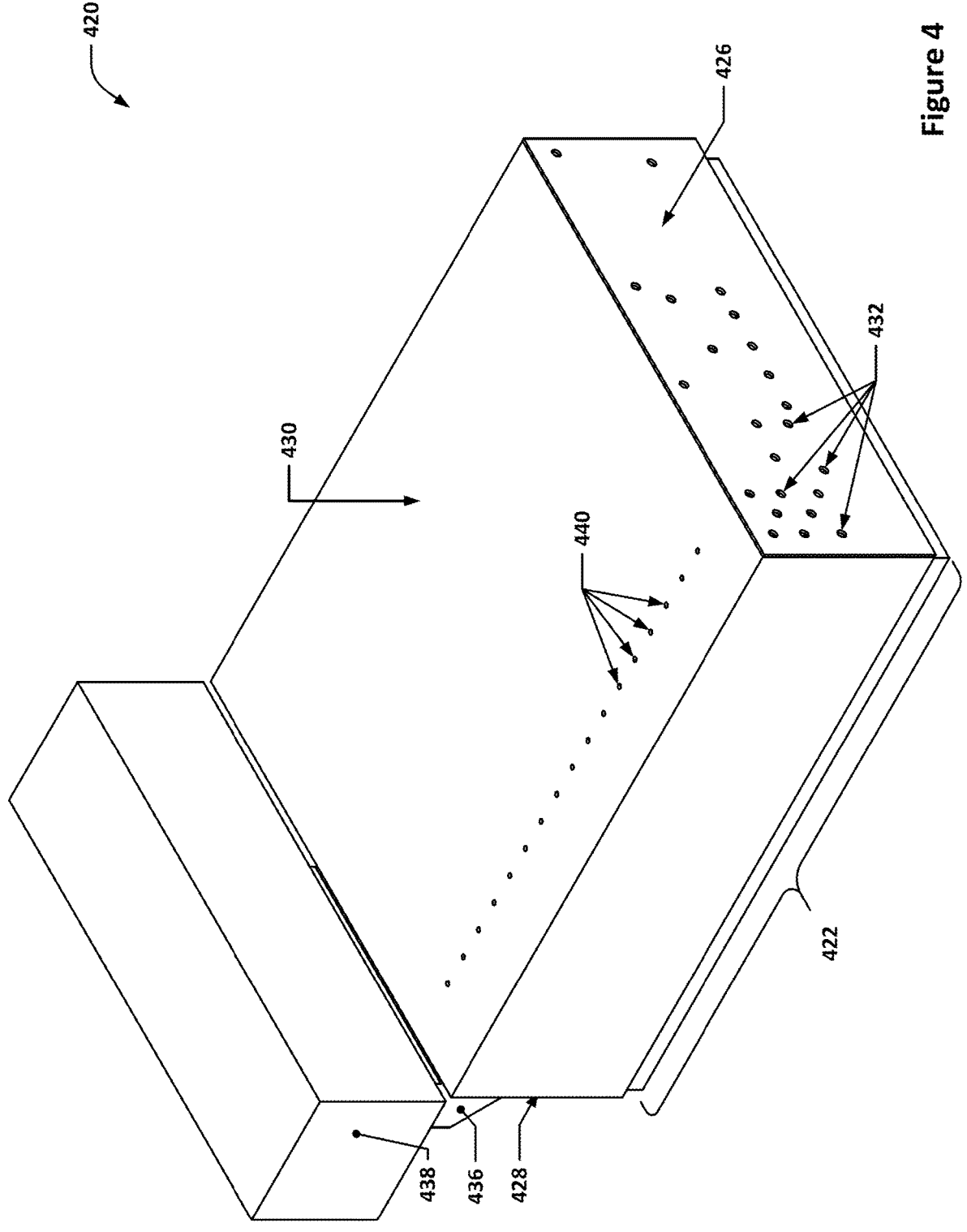
FIG. 4 depicts an example gas box for a semiconductor processing tool.

FIG. 4 depicts an example gas box for a semiconductor processing tool. In FIG. 4, a gas box 420 is shown that includes a housing 422 that is connected with an exhaust plenum 438 by an exhaust duct 436. The exhaust plenum 438, while shown here as a sealed volume, may be fluidically connected with a scrubber system and/or exhaust fan or pump unit that may be controlled to draw air from the housing 422 through the exhaust duct 436.

The housing 422 may have a first side 426, a second side 428 generally opposite the first side 426, and a third side 430 that is generally interposed between the first side 426. In this example, the third side 430 is the "back" of the housing 422, with the side of the housing opposite the third side 430 being provided by a door (not separately called out, but somewhat similar to the door 104 discussed earlier—although without the door vent holes 106). The first side 426, in this example, would normally be oriented facing downward, with the second side 428 facing upward—although other orientations may be used as well.

As can be seen in FIG. 4, the first side 426 has a plurality of inlet holes 432 that are arranged in an almost somewhat randomized pattern. The locations of the inlet holes 432, however, may be selected strategically so as to align with various "open" regions within the interior volume of the housing 422, as will be discussed later with respect to other Figures. In this example, there are 23 inlet holes 432, with approximately one third of them clustered in a small region to the left side of the first side 426. The inlet holes, in this particular case, are sized to be approximately 9 mm in diameter.

Also visible in FIG. 4 are cross-flow holes 440, which are arranged generally along a linear axis and on the third side 430. In this particular example implementation, there are 17 such cross-flow holes 440, each being approximately 5 mm in diameter, but in other implementations, there may be additional or fewer such cross-flow holes. Thus, air that flows into the housing 422 via the cross-flow holes 440 will generally be caused to flow, at least initially, in a direction perpendicular to the third side 430 before turning to join with the flow of air from the inlet holes 432 to the exhaust duct 436. It will be understood that the housing 422 shown in FIG. 4 is a simplified representation of a gas box housing, and omits various features that may be present in an actual gas box housing, e.g., cable feed-throughs, mounting holes or brackets, hinges, gas feed-throughs, etc. The simplified representation is used to allow for more detailed focus on the ventilation-related features that are provided in the gas box 420.

Figure 5:
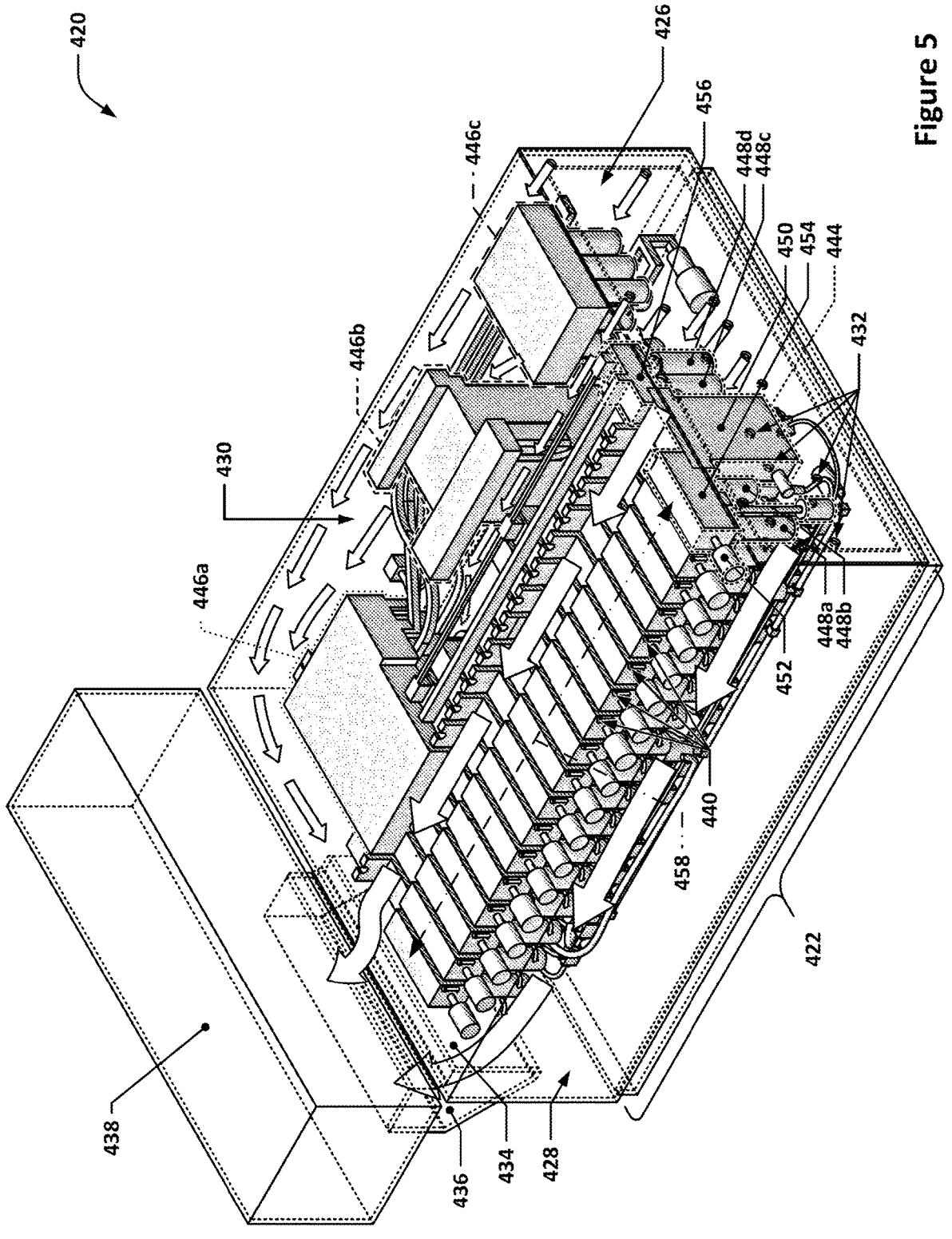
FIG. 5 depicts the example gas box of FIG. 4 with internal gas flow components thereof visible.

FIG. 5 depicts the example gas box of FIG. 4 with internal gas flow components thereof visible. As can be seen in FIG. 5, the gas box includes a number of gas flow components 442, e.g., valves, manifold blocks, regulators, and mass flow controllers. While a wide variety of different such gas flow components 442 may be housed within the gas box 420, a large number of such gas flow components may be assembled into a plurality of first gas flow component assemblies 444. Such first gas flow component assemblies 444 may each, for example, feature a plurality of gas flow components configured to provide for precise control over a different gas flow. For example, the first gas flow component assemblies 444—only one is outlined in broken lines and called out, but FIG. 5 depicts a total of 18 first gas flow component assemblies 444 arranged in a linear array—may each include, in some instances, a high-pressure manifold block 454 that is fluidically connected with a mass flow controller (MFC) 450 which is, in turn, fluidically connected with a low-pressure manifold block 456.

The high-pressure manifold block 454 and the low-pressure manifold block 456 may, for example, be fluidically connected with valves 448*a/b* and 448*c/d*, respectively.

The first gas flow component assemblies 444 may, for example, each receive gas that is at supra-atmospheric pressure via a corresponding releasable fluidic fitting 452 that is fluidically connected with the high-pressure manifold block 454. This gas may, for example, be routed through the valves 448*a/b* before being flowed through the MFC 450 and into the low-pressure manifold block 456, which is typically in kept at sub-atmospheric pressures, e.g., similar to the pressures commonly used in semiconductor processing chambers.

The releasable fluidic fittings 452 may, for example, be compression fittings or other suitable threaded fittings (or other fittings that do not use threaded connections), although they are represented in FIG. 5 as simple cylinders. Gas lines that may be used to supply the various process gases at supra-atmospheric pressure may be routed into the gas box 420, e.g., through a feed-through in a wall of housing 422, and connected to corresponding ones of the releasable fluidic fittings using corresponding fittings. The gas lines and feed-through are not shown in FIG. 5 to avoid undue clutter, although it will be appreciated that such gas lines may, for example, extend out from each releasable fluidic fitting 452 in a coaxial manner and then pass through a feed-through that is located in the wall of the housing 422 facing the releasable fluidic fittings 452.

While most of the fluidic connections within the gas box 420 may be made and extensively leak-checked, and any leaks rectified, before the gas box 420 is assembled (for example, the third side 430 may actually be a removable panel of the housing 422, allowing the components to be assembled to it prior to connecting the panel to the remainder of the housing 422), the connections made between the releasable fluidic fittings 452 and the gas supply lines that supply processing gases to the gas box 420 are less easy to check, as the gas box 420 must necessarily already be installed on a tool in a fabrication facility having such connections, making it difficult to access with leak testing equipment. Connections to the releasable fluidic fittings 452 must also necessarily be made in-situ in the fabrication facility, which increases the chances for potential leaks.

Thus, the releasable fluidic fittings 452 typically represent the highest likelihood for potential leaks—especially taking into account the fact that such fluidic connections are under supra-atmospheric pressure. For example, while there may be other releasable fluidic fittings or other fluidic connections used elsewhere in the gas box 420, if those other locations on the "low-pressure" side of the MFCs 450, any potential leakage will be of atmospheric air going into the low-pressure gas flow of the gas flow control components downstream of the MFCs 450 as opposed to of the gas within the gas flow control components leaking out into the interior volume of the gas box 420.

In some implementations, there may also be other gas flow component assemblies, e.g., second gas flow component assemblies 446*a-c*, which may also provide additional gas box functionality. The first gas flow component assemblies 444 and the second gas flow component assemblies 446*a-c*, if present, may, for example, be mounted to the third side 430 of the housing 422, e.g., via threaded fasteners (not shown) that are screwed through holes (not shown) in the third side 430 and into threaded holes (also not shown) in the first gas flow component assemblies 444. It will be understood that when reference is made herein to "cross-flow holes" 440 and "inlet holes" 432, such references are intended to refer to openings or holes in the housing that are provided explicitly to provide for ventilation of the gas box 420, as opposed to other holes that may be present in the housing but which, once the gas box 420 is properly installed and operational, are not used to provide for ventilation. For example, such non-ventilation holes may include, as discussed above, holes for mounting screws for holding the first gas flow component assemblies 444 in place, holes for mounting the gas box 420 to a support structure, holes for gas lines that may be fluidically connected with the releasable fluidic fittings 452, holes for electrical connectors, leak paths through mechanical latches that may be used to hold the door shut, etc. Such non-ventilation holes may also include small gaps that may occur between two panels that are overlapped with each other, small gaps that may arise through manufacturing defects, etc. Such non-ventilation holes may provide some amount of gas flow into the interior volume of the housing 422, but the amount of such gas flow through the non-ventilation holes may be relatively miniscule compared to that which flows through the inlet holes 432 and the cross-flow holes 440. For example, in some implementations, the total open cross-sectional area of such non-ventilation holes may be on the order of 10% or 20% less of the total cross-sectional area of the inlet holes 432 and the cross-flow holes 440. The "total open cross-sectional area" refers to the cross-sectional area of such non-ventilation holes that is available for incidental air flow, i.e., not otherwise occupied or blocked by other components, e.g., a screw shaft, a cable, etc.

As can be seen in FIG. 5, the first gas flow component assemblies 444 are arrayed along a first axis 458. The arrows shown in FIG. 5 depict nominal flow paths, with the larger-sized arrows representing the more direct, less circuitous flow paths that air which is drawn through the gas box 420 would follow. For example, a first portion of the air that flows into the housing 422 through the inlet holes 432 may generally follow the flow paths represented by the larger arrows flowing from the inlet holes 432 towards exhaust opening 434 (while a single, large exhaust opening is shown, there may also be a plurality of exhaust openings, e.g., a perforated panel area, that may serve a similar purpose of fluidically connecting the interior volume of the housing 422 with the exhaust duct 436). At the same time, a second portion of the air that flows into the housing 422 via the cross-flow holes 440 may flow in a direction generally perpendicular to the third side 430 before turning to merge with the first portion of the air that flows into the housing. For example, the second portion of the air that flows into the housing 422 may turn and merge with a generally free stream of air that enters the housing 422 via the multiple inlet holes 432 located at the far left of the first side 426 (e.g., the eight left-most inlet holes 432 in this example) before being conveyed to the exhaust opening 434.

Figure 6:
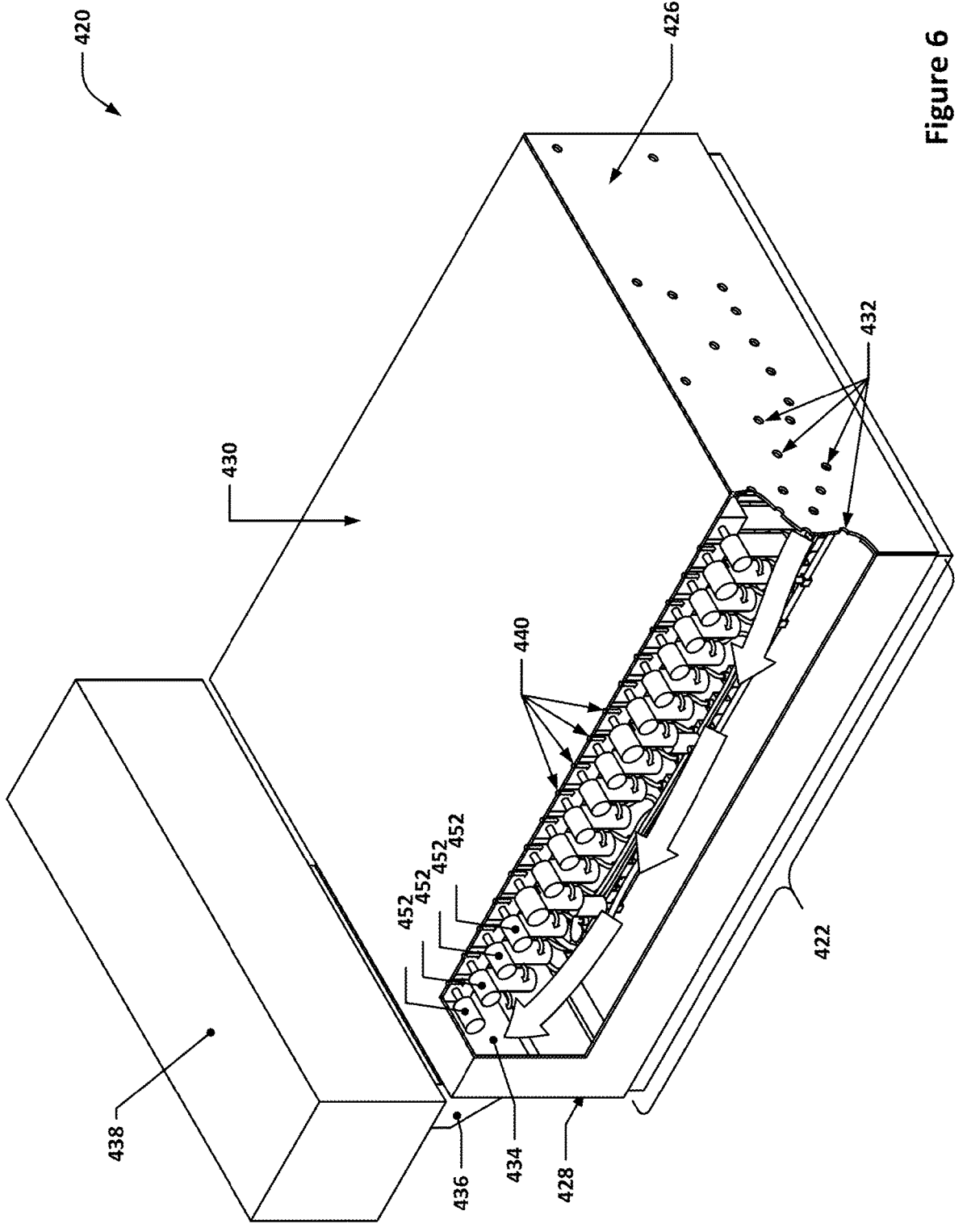
FIG. 6 depicts the example gas box of FIG. 4 with a portion of the housing cut away.

FIG. 6 depicts the example gas box of FIG. 4 with a portion of the housing cut away. In FIG. 6, the "tunnel" nature of the flow path that leads from the inlet holes 432 that are on a side of the first side 426 that is closest to the releasable fluidic fittings 452 to the exhaust opening 434 is more clearly visible. As can be seen, there is a relatively unobstructed flow path extending from the leftmost inlet holes 432 to the exhaust opening 434. The top long edge of the cutaway section bisects the cross-flow holes 440, and it can be seen how the air flow that is directed downward from the cross-flow holes 440 past the releasable fluidic fittings 452 may sweep any stagnant air from between the releasable fluidic fittings and into the free stream flow that exists in the tunnel portion where it may then be carried to the exhaust opening 434 and be removed from the housing 422.

Figure 7:
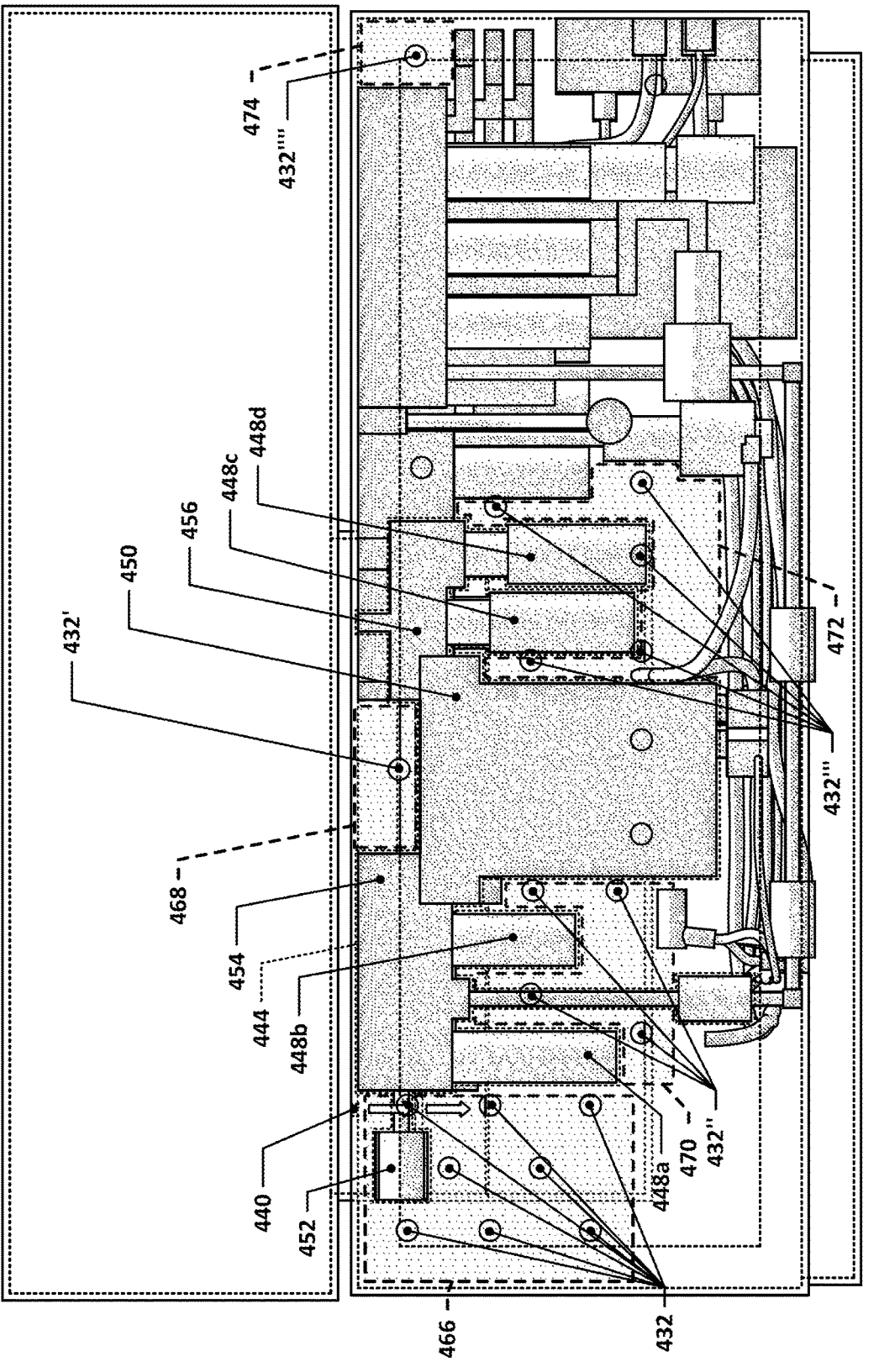
FIG. 7 depicts a bottom view of the example gas box of FIG. 4.

FIG. 7 depicts a bottom view of the example gas box of FIG. 4. As can be seen and as mentioned previously, there is a high concentration of inlet holes 432 on the left side of the first side 426 (relative to the orientation of the view in FIG. 7). In this example, 8 of the 23 inlet holes 432 are arranged within a first region 466 that is generally bounded by the high-pressure manifold blocks 454 and valves 448*a*, the third side 430, the side of the gas box bounded by the first side 426, the second side 428, and third side 430 when viewed from a direction parallel to the first axis 458. It will be noted that the volume that would be formed when the first region 466 is extruded along the first axis 458 is generally free of obstructions except for the releasable fluidic fittings 452 (there may also be some pneumatic tubing and/or electrical wiring harnesses routed near the sides of this volume, but the volume may nonetheless be generally configured to promote relatively uninterrupted flow of gas from the inlet holes 432 within the first region 466 to the exhaust opening 434.

It will also be observed in FIG. 7 that most of the other inlet holes 432 are positioned in locations where there is a relatively unobstructed flow path from those inlet holes 432 to the second side 428. For example, the inlet holes 432', 432", 432'", and 432"" are all positioned on the first side 426 in locations that generally align with, or nearly align with, unobstructed flow paths from the first side 426 to the second side 428 along directions parallel to the first axis 458.

For example, the inlet hole 432' is positioned so as to direct air into a first region 466 that corresponds with a gap that exists between the MFCs 450 and the third side 430. This gap may, for example, be provided by the high-pressure manifold blocks 454 and the low-pressure manifold blocks 456, which may be mounted to the third side 430 and act to lift the MFCs 450 off of the first side 426. The volume bounded by the third side 430, the high-pressure manifold blocks 454, the low-pressure manifold blocks 456, and the MFCs 450—represented here by the second region 468—may form, in effect, a tunnel underneath the MFCs 450. Leaking gas from the high-pressure side of the first gas flow component assemblies 444 that may diffuse or flow towards the low-pressure manifold block 456 may, in crossing transversely through this "tunnel" may be swept away by the air flow from the inlet hole 432' and into the exhaust opening 434.

In another example, the inlet holes 432" are positioned so as to direct air into the gaps between the valves 448*b* and the MFCs 450, as well as into the gaps between the valves 448*a* and 448*b* (while there is a tube and a tubing fitting extending away from the high-pressure manifold shown in this gap, in this example, this tube and fitting are only present on 4 of the 18 first gas flow component assemblies—the gap is otherwise relatively free of obstructions) and in between the valves 448*a* and 448*b* and the door 423 to the gas box 420. Thus, the inlet holes 432" may generally direct air down a corridor having a cross-section similar to that of third region 470.

In a further example, the inlet holes 432'" are positioned so as to direct air into the gap between the MFCs 450 and the valve 448*c*, between the valves 448*c* and 448*d* and the door 423 to the gas box 420, and also along the side of the valves 448*d*—a flow path having a cross-section generally corresponding to the fourth region 472. Similarly, the inlet hole 432"" is positioned so as to direct air along a small "corridor," e.g., having a cross-section similar to that of fifth region 474, formed along an edge of the gas box 420 spanning between the first side 426 and the second side 428 and arising from an intersection of the third side 430 with another side of the housing 422.

The above discussion has focused on 19 of the 23 inlet holes 432 in the present example, but the remaining inlet holes 432 may also direct air down similarly unobstructed flow paths. For example, the two inlet holes 432 of the remaining inlet holes 432 that do not overlap with the MFCs 450 in FIG. 7 actually direct air down regions of the gas box 420 that are also largely unobstructed—the components that are shown as being directly in the path of these inlet holes 432 in FIG. 7 are, in actuality, located proximate to the second side 428 such that air flow from the first side 426 through such inlet holes 432 may traverse most of the interior volume of the gas box 420 before encountering such components.

In some implementations, 80% or more of the inlet holes 432 and/or total cross-sectional area of the inlet holes 432 may be positioned such that they overlap, at least in part, with unobstructed flow paths in directions parallel to the first axis 458 when viewed from a direction parallel to the first axis 458. In this context, "unobstructed flow paths" refers to flow paths in which there are no gas flow components such as MFCs, valves, or manifold blocks located within the flow path for at least 50% of the distance from the first side 426 to the second side 428; an unobstructed flow path in this context may nonetheless have cables, flexible tubes, rigid tubing, tubing fittings, or other smaller components present within the flow path and still be considered to be "unobstructed."

Figure 8:
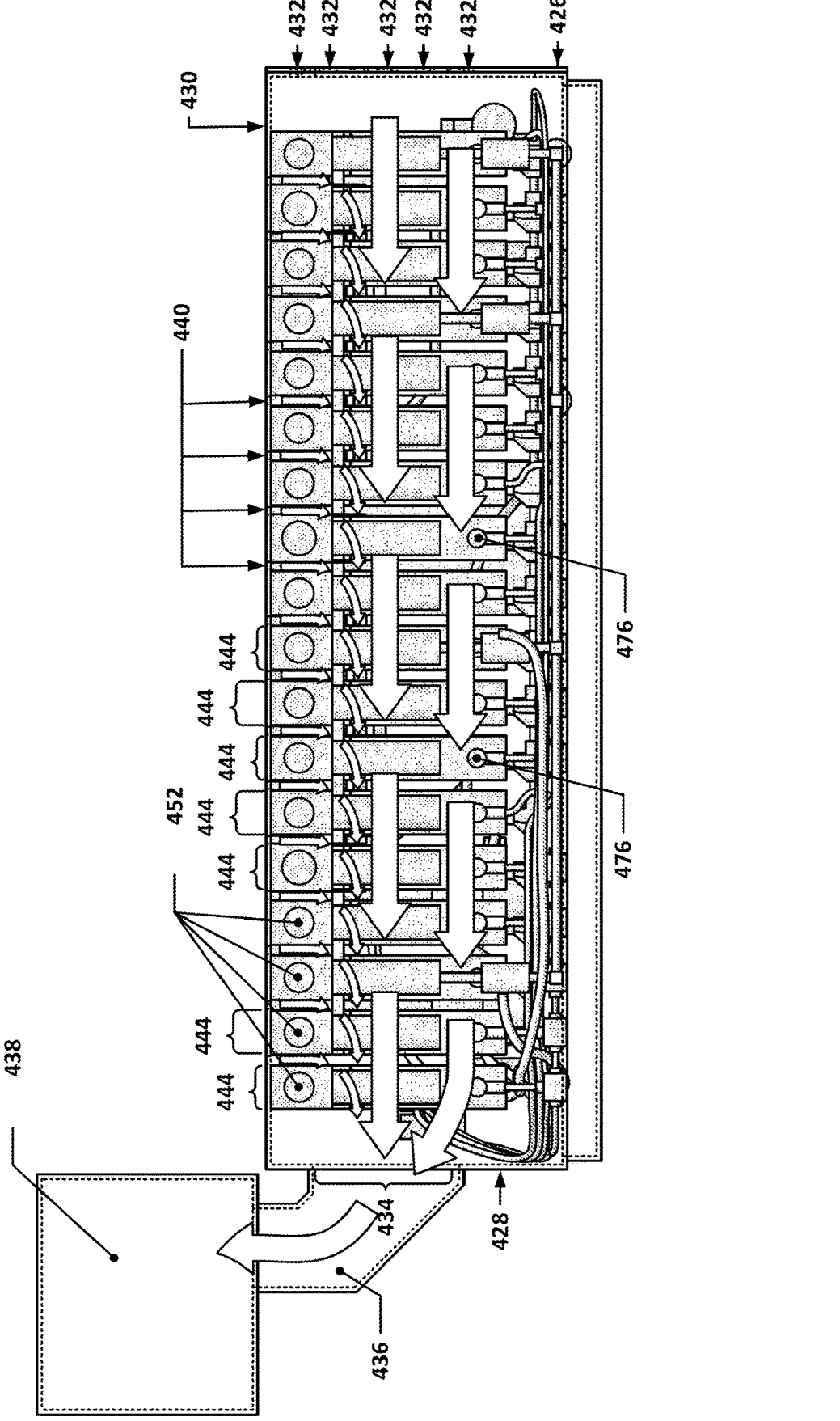
FIG. 8 depicts a side view of the example gas box of FIG. 4.

FIG. 8 depicts a side view of the example gas box of FIG. 4. As can be seen, the air flow from the inlet holes 432 in the first region 466 to the exhaust opening 434 generally acts as a free stream, with little or no obstruction interfering with the air flow. The air that is drawn in through the cross-flow holes may generally first flow in a direction generally perpendicular to the third side 430 before turning to merge with the free stream flow and be carried to the exhaust opening 434. It is to be noted that a majority of the free stream flow that is shown by the large arrows in FIG. 8 is located between the releasable fluidic fittings 452 and electrical connectors 476 that provide power and control signals to the MFCs 450 (only two electrical connectors 476 are explicitly called out, but each MFC 450 may have a corresponding electrical connector). The electrical connectors 450 are potential ignition sources. By developing a free-stream flow from the inlet holes 432 in the first region 466 to the exhaust opening 434, the velocity of the air flowing from the inlet holes 432 in the first region 466 to the exhaust opening 434 may be kept relatively high, e.g., 0.5 m/s to 2 m/s, there by quickly diluting and evacuating any leaking gas that is directed into the free-stream flow by the cross-flow holes 440. This prevents any gas that potentially leaks from the releasable fluidic fittings 452 from reaching the electrical connectors 476 in sufficient quantities to cause the concentration of such gas proximate to the electrical connectors 476 to exceed the ¼ LEL parameter discussed earlier.

Figure 9:
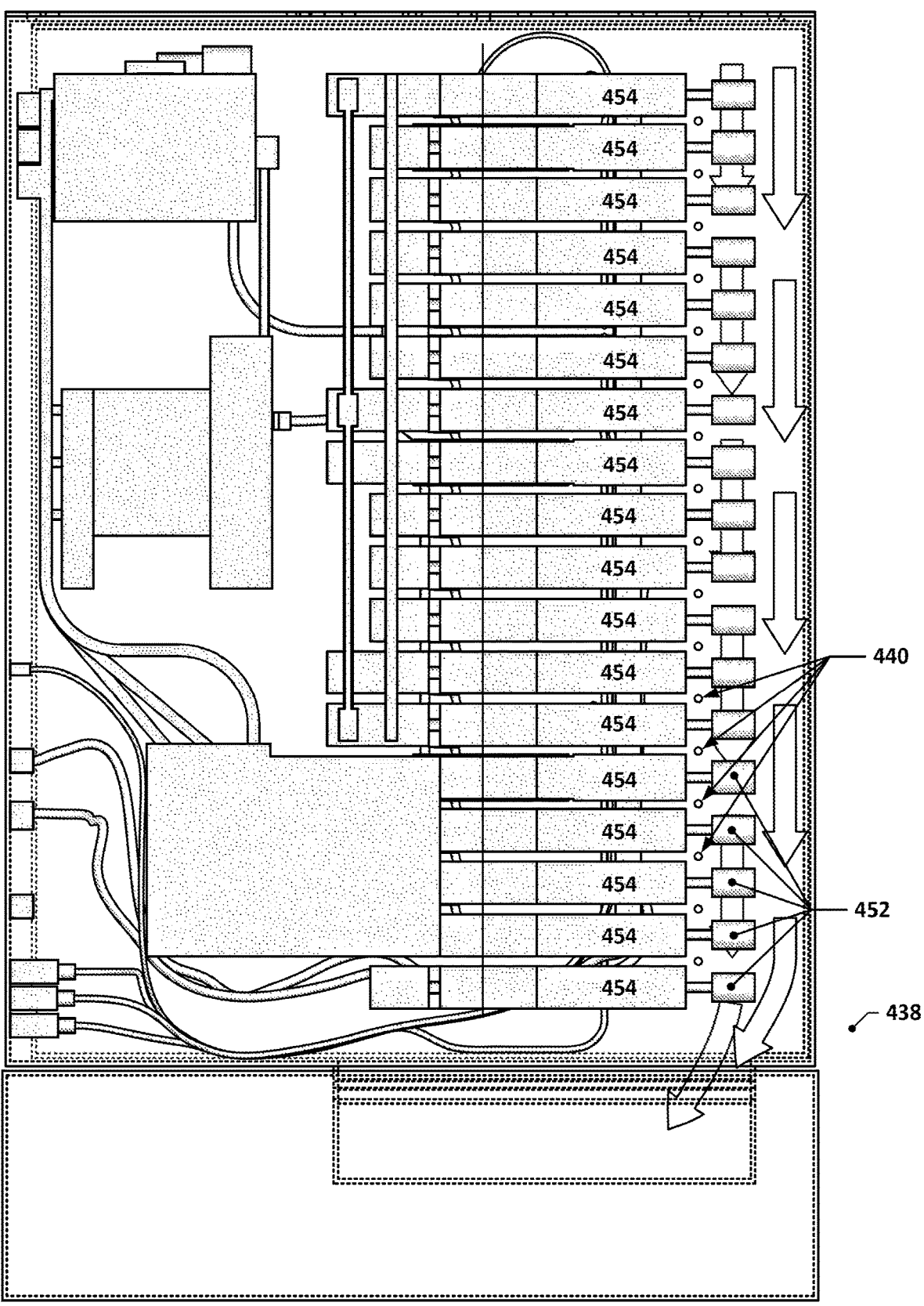
FIG. 9 depicts a bottom view of the example gas box of FIG. 4.

FIG. 9 depicts a bottom view of the example gas box of FIG. 4. From the bottom view, it can be seen that the cross-flow holes 440 are positioned at locations between the ends of the releasable fluidic fittings 452 and the gas flow component to which they are fluidically connected, e.g., the high-pressure manifold block 454 when viewed along a direction perpendicular to the third side 430. They are also positioned at locations midway between adjacent releasable fluidic fittings 452 when viewed along this direction, which may help ensure that there are no obstructions that might hinder the air flow through the cross-flow holes 440 and reduce the effectiveness of such air flow in removing any gas that may potentially leak from the releasable fluidic fittings 452. In some such implementations, an additional cross-flow hole or holes 440 may be provided in a corresponding position on the outer side(s) of the last releasable fluidic fitting(s) 452 and high-pressure manifold block(s) 454 in the linear array of first gas flow component assemblies 444, e.g., there may be 18 or 19 cross-flow holes 440 provided for a linear array of 17 first gas flow component assemblies 444 (17 at positions in between adjacent first gas flow component assemblies 444 and one or two positioned at similar positions beyond the end-most first gas flow component assemblies 444. In some other implementations, however, the cross-flow holes 440 may be located in other or additional locations. For example, in some implementations, the cross-flow holes 440 may be located in positions that overlap, at least partially, with the releasable fluidic fittings 452 or the tubing that is fluidically connected to the releasable fluidic fittings 452 when viewed from the perspective of FIG. 9. While this may direct air flow more directly onto the releasable fluidic fittings, it may also result in lower-velocity cross-flow since the cross-flows may slow down due to the obstructions in the flow path. In some implementations, cross-flow holes may be provided that are positioned in both arrangements, e.g., blending the two placement options discussed above. In some implementations, multiple smaller cross-flow holes 440 may be used in place of a single, larger cross-flow hole 440, e.g., a small cluster or tightly packed group of smaller cross-flow holes 440 may be used in place of a single, larger diameter cross-flow hole 440. In some implementations, the number of cross-flow holes 440 (or clusters of smaller-size cross-flow holes 440) that may be used for a given gas box design may be equal to the number of mass-flow controllers 450 or high-pressure manifold blocks 454 in the gas box 420, plus or minus one.

It will be noted and understood that while there is only a single row of cross-flow holes 440 shown in the examples discussed herein, cross-flow holes may be provided as needed in the vicinity of any potential leak sources, e.g., other supra-atmospheric pressure fluidic connections, where the air flow from the inlet holes 432 to the exhaust opening(s) 434 may be insufficient to disrupt stagnant air or eddying air flow that may cause potentially leaking gas to concentrate in those locations.

In some implementations, the total cross-sectional area of the inlet holes 432 may be more than the total cross-sectional area of the cross-flow holes 440. For example, in some implementations, the total cross-sectional area of the inlet holes 432 may be between 3 and 6 times or 4 and 5 times, e.g., about 4.5 times, that of the cross-flow holes 440. In some implementations, for example, the total cross-sectional area of the inlet holes 432 may be on the order of 1200 to 1800 mm² and the total cross-sectional area of the cross-flow holes 440 may be on the order of 300 to 400 mm². The exhaust opening(s) 434, however, may be sized to be considerably larger in terms of total cross-sectional area than the total cross-sectional areas of the inlet holes 432 and cross-flow holes 440, e.g., 10× or more larger.

In some implementations, the cross-flow holes 440 may be sized so as to have diameters of greater than 4 mm, e.g., about 5 mm so as to create cross-flow jets of air that reach sufficient velocity when drawn into the housing 422 that the jets may reach potential leak points, e.g., releasable fluidic fittings. At the same time, the inlet holes 432 may be sized larger, e.g., 8 to 12 mm, so as to flow air into the housing 422 at a generally greater rate than the cross-flow holes, thereby allowing the air from the inlet holes 432 to develop into a smooth free-stream flow within the housing 422 and provide sufficient exhaust flow to evacuate any potentially leaking gas.

To give a sense for the potential performance increase of an example gas box such as that discussed above with respect to FIGS. 4 through 9, testing of a similar gas box showed that the depicted configuration was able to achieve the ¼ LEL requirement discussed above using a volumetric flow rate out of the exhaust opening of approximately 20 cfm. This flow rate was sufficient, for example, to flow at least five internal free volume's worth of air through the gas box every minute, which is another requirement of the SEMI S6 standard. The internal free volume of the gas box is the volume within the housing of the gas box that is not otherwise occupied by gas flow components, tubing, cables, etc. At the 20 cfm flow rate mentioned above, this requirement was exceeded by nearly 70%. In comparison, a gas box similar to that shown in FIGS. 1 through 3 generally required a flow rate of 60 cfm in order to obtain the equivalent performance.

In some implementations, a controller may be provided as part of a multi-station chamber or tool, which may be part of the above-described examples. Such systems can comprise semiconductor processing equipment, including the processing tool or tools and/or chamber or chambers such as are described above, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the equipment disclosed herein, including, for example, various valves, MFCs, and other equipment associated with the gas boxes discussed herein.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus, as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include multi-station plasma etch chambers or modules, multi-station deposition chambers or modules, multi-station spin-rinse chambers or modules, multi-station metal plating chambers or modules, multi-station clean chambers or modules, multi-station bevel edge etch chambers or modules, multi-station physical vapor deposition (PVD) chambers or modules, multi-station chemical vapor deposition (CVD) chambers or modules, multi-station atomic layer deposition (ALD) chambers or modules, multi-station atomic layer etch (ALE) chambers or modules, multi-station ion implantation chambers or modules, multi-station track chambers or modules, or any other systems with semiconductor processing chambers that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Figure 10:
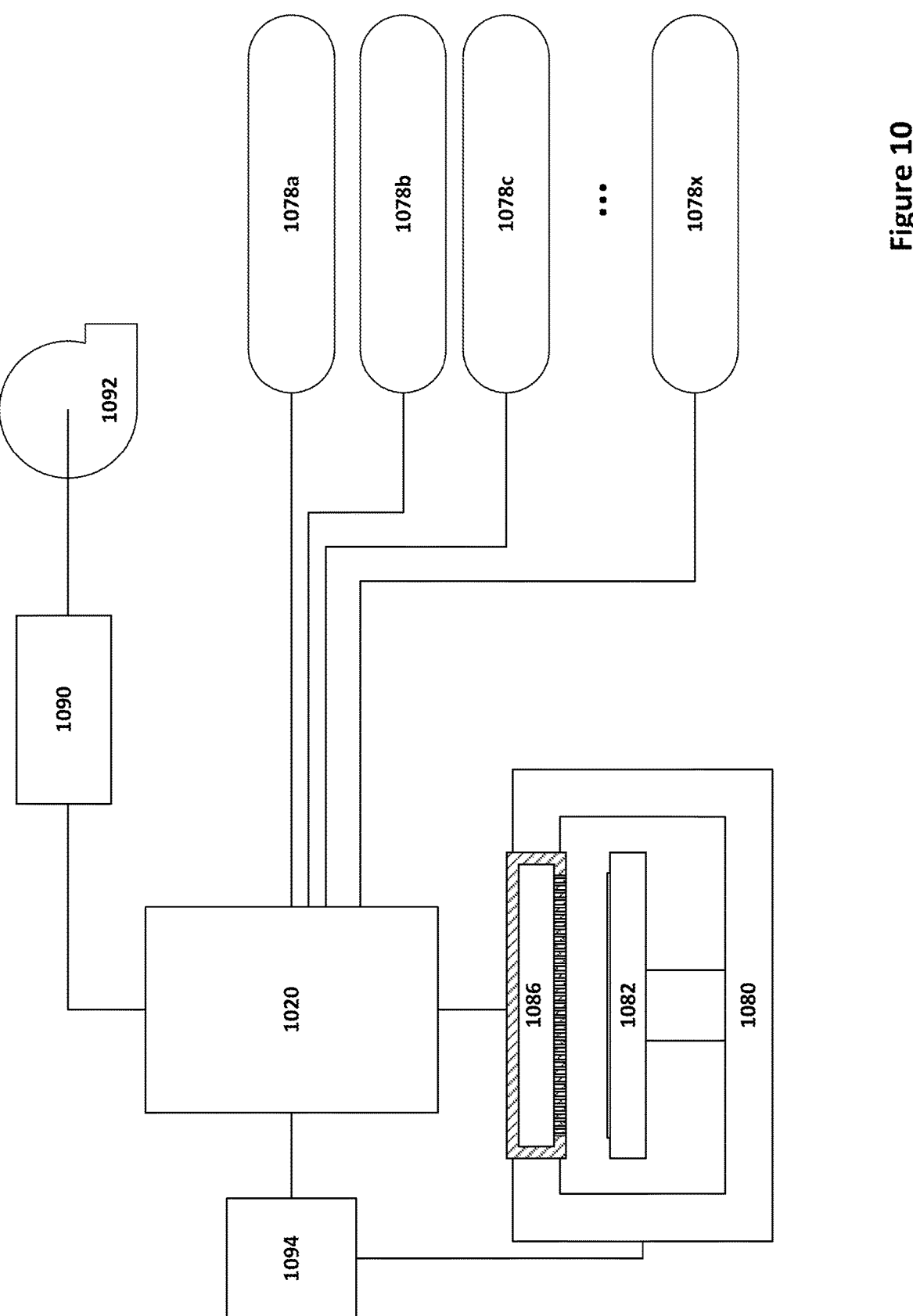
FIG. 10 depicts a schematic of an example semiconductor processing system that may include a gas box such as is described herein.

FIG. 10 depicts a schematic of an example semiconductor processing system that may include a gas box such as is described herein. The semiconductor processing system of FIG. 10 includes a semiconductor processing chamber 1080 that may include a pedestal or wafer support 1082 that may support a wafer 1084 within the semiconductor processing chamber 1080. The semiconductor processing chamber may also include a showerhead or gas distributor 1086 that is positioned above the pedestal or wafer support 1082 and which may be used to distribute semiconductor processing gases across the surface of the wafer 1084.

The showerhead or gas distributor 1086 may be fluidically connected with gas flow components within a gas box 1020, which may be configured as discussed herein. The gas flow components within the gas box 1020 may also be fluidically connected with a plurality of facility gas sources 1078a/b/c, etc., which may be used to provide supra-atmospheric pressure gas to the gas box 1020. The gas box 1020 may also feature an exhaust opening that may be fluidically connected with a scrubber system 1090 that is, in turn, fluidically connected with a pump or blower 1092. The pump or blower 1092, when activated, may draw air from the gas box 1020 and through the scrubber system 1090, thereby causing any potential leaking gases from the gas box 1020 to be evacuated through the scrubber system 1090.

The operation of the gas box 1020 and the semiconductor processing chamber 1080 may be controlled, for example, by a controller 1094, which may include one or more processors and one or more memory devices, as discussed above. In some implementations, the controller may also control the scrubber system 1090 and/or the blower or pump 1092.

It is to be understood that the phrases "for each <item> of the one or more <items>," "each <item> of the one or more <items>," or the like, if used herein, are inclusive of both a single-item group and multiple-item groups, i.e., the phrase "for . . . each" is used in the sense that it is used in programming languages to refer to each item of whatever population of items is referenced. For example, if the population of items referenced is a single item, then "each" would refer to only that single item (despite the fact that dictionary definitions of "each" frequently define the term to refer to "every one of two or more things") and would not imply that there must be at least two of those items. Similarly, the term "set" or "subset" should not be viewed, in itself, as necessarily encompassing a plurality of items—it will be understood that a set or a subset can encompass only one member or multiple members (unless the context indicates otherwise).

For the purposes of this disclosure, the term "fluidically connected" is used with respect to volumes, plenums, holes, etc., that may be connected with one another in order to form a fluidic connection, similar to how the term "electrically connected" is used with respect to components that are connected together to form an electric connection. The term "fluidically interposed," if used, may be used to refer to a component, volume, plenum, or hole that is fluidically connected with at least two other components, volumes, plenums, or holes such that fluid flowing from one of those other components, volumes, plenums, or holes to the other or another of those components, volumes, plenums, or holes would first flow through the "fluidically interposed" component before reaching that other or another of those components, volumes, plenums, or holes. For example, if a pump is fluidically interposed between a reservoir and an outlet, fluid that flowed from the reservoir to the outlet would first flow through the pump before reaching the outlet.

The use, if any, of ordinal indicators, e.g., (a), (b), (c) . . . or the like, in this disclosure and claims is to be understood as not conveying any particular order or sequence, except to the extent that such an order or sequence is explicitly indicated. For example, if there are three steps labeled (i), (ii), and (iii), it is to be understood that these steps may be performed in any order (or even concurrently, if not otherwise contraindicated) unless indicated otherwise. For example, if step (ii) involves the handling of an element that is created in step (i), then step (ii) may be viewed as happening at some point after step (i). Similarly, if step (i) involves the handling of an element that is created in step (ii), the reverse is to be understood.

It should be appreciated that all combinations of the foregoing concepts (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

It is to be further understood that the above disclosure, while focusing on a particular example implementation or implementations, is not limited to only the discussed example, but may also apply to similar variants and mechanisms as well, and such similar variants and mechanisms are also considered to be within the scope of this disclosure.

What is claimed is:

1. A gas box for a semiconductor processing apparatus, the gas box comprising:
a housing enclosing an interior volume;
a door; and
a plurality of first gas flow component assemblies located within the interior volume, wherein:
    the plurality of first gas flow component assemblies are generally arranged along a first axis,
    the housing has a first side with one or more inlet holes and a second side with one or more exhaust openings,
    the housing has a third side that is substantially parallel to the first axis and generally interposed between the first side and the second side,
    the housing has an opening in a side opposite the third side,
    the door is mounted so as to be movable between an open state and a closed state,
    the door, in the closed state, closes off the opening,
    the third side has a plurality of cross-flow holes generally arranged along a second axis that is substantially parallel to the first axis, and
    the one or more inlet holes, the one or more exhaust openings, and the plurality of cross-flow holes are configured such that when a) a negative pressure differential exists between the one or more exhaust openings and the one or more inlet holes and b) the one or more inlet holes and the plurality of cross-flow holes are fluidically connected with air, at least a first portion of the air is drawn from the one or more inlet holes, through the housing, and to the one or more exhaust openings in directions predominantly aligned with the first axis, and at least a second portion of the air is drawn from the plurality of cross-flow holes, past the first gas flow component assemblies and in a direction generally transverse to the first axis, and then to the one or more exhaust openings.

2. The gas box of claim 1, wherein:
the first gas flow component assemblies of each adjacent pair of one or more adjacent pairs of the first gas flow component assemblies have at least one corresponding cross-flow hole of the cross-flow holes interposed therebetween when viewed along a direction perpendicular to the third side.

3. The gas box of claim 1, wherein:
the first gas flow component assemblies of each adjacent pair of the first gas flow component assemblies have at least one corresponding cross-flow hole of the cross-flow holes interposed therebetween when viewed along a direction perpendicular to the third side.

4. The gas box of claim 1, wherein:
each of one or more of the first gas flow component assemblies has a portion thereof that overlaps with at least one corresponding cross-flow hole of the cross-flow holes when viewed along a direction perpendicular to the third side.

5. The gas box of claim 1, wherein:
each of the first gas flow component assemblies has a portion thereof that overlaps with at least one of the cross-flow holes when viewed along a direction perpendicular to the third side.

6. The gas box of claim 1, wherein:
each first gas flow component assembly includes a corresponding first gas flow component, second gas flow component, and first releasable fluidic fitting, and
the first gas flow component of each first gas flow component assembly is fluidically interposed between the second gas flow component of that first gas flow component assembly and the first releasable fluidic fitting of that first gas flow component assembly.

7. The gas box of claim 6, wherein, for each first gas flow component assembly of one or more of the first gas flow component assemblies, the cross-flow hole that is closest thereto is at a location interposed between the first gas flow component of that first gas flow component assembly and an end of the first releasable fluidic fitting of that first gas flow component assembly that is furthest from that first gas flow component when viewed from a direction perpendicular to the third side.

8. The gas box of claim 6, wherein, for at least one or more of the first gas flow component assemblies, the first gas flow component is a valve and the second gas flow component is a mass flow controller.

9. The gas box of claim 8, wherein:
there are at least two of the first gas flow component assemblies in which the first gas flow component is a valve and the second gas flow component is a mass flow controller, and
for each of the first gas flow component assemblies, the first gas flow component is a valve and the second gas flow component is a mass flow controller.

10. The gas box of claim 8, wherein the first gas flow component and the second gas flow component of each of the first gas flow component assemblies are, respectively, a valve and a mass flow controller.

11. The gas box of claim 9, wherein the mass flow controllers are, at least in part, spaced apart from the third side such that a gap is formed between at least part of each mass flow controller and the third side.

12. The gas box of claim 11, wherein at least one of the one or more inlet holes is positioned so as to overlap, at least in part, with the gap when viewed along the first axis.

13. The gas box of claim 1, wherein the gas box is configured such that each cross-flow hole is positioned so as to be in a location that appears, when viewed along a direction perpendicular to the third side, to be proximate to a releasable fluidic connection that is configured to conduct gas at a supra-atmospheric pressure during normal operation of the gas box.

14. The gas box of claim 1, wherein:
the one or more inlet holes have a total cross-sectional area of X,
the cross-flow holes have a total cross-sectional area of Y, and
X is between 4 and 5 times Y.

15. The gas box of claim 1, wherein:
the one or more inlet holes have a total open cross-sectional area of X,
the cross-flow holes have a total open cross-sectional area of Y,
the one or more exhaust openings have a total open cross-sectional area of Z, and
any other fluidic flow paths into or out of the gas box, when the door is in the closed state and the gas box is in a normal operational state and other than the one or more inlet holes, the cross-flow holes, and the one or more exhaust openings, have a total open cross-sectional area of less than 20% of X+Y.

16. The gas box of claim 15, wherein the other fluidic flow paths into or out of the gas box, when the door is in the closed state and the gas box is in a normal operational state and other than the one or more inlet holes, the cross-flow holes, and the one or more exhaust openings, have a total open cross-sectional area of less than 10% of X+Y.

17. The gas box of claim 1, wherein:
the first gas flow component assemblies of each adjacent pair of one or more adjacent pairs of the first gas flow component assemblies have at least one corresponding cross-flow hole of the cross-flow holes interposed therebetween when viewed along a direction perpendicular to the third side,
each first gas flow component assembly includes a corresponding first gas flow component, second gas flow component, and first releasable fluidic fitting, and
the first gas flow component of each first gas flow component assembly is fluidically interposed between the second gas flow component of that first gas flow component assembly and the first releasable fluidic fitting of that first gas flow component assembly.

18. The gas box of claim 6, wherein:
for each first gas flow component assembly of one or more of the first gas flow component assemblies, the cross-flow hole that is closest thereto is at a location interposed between the first gas flow component of that first gas flow component assembly and an end of the first releasable fluidic fitting of that first gas flow component assembly that is furthest from that first gas flow component when viewed from a direction perpendicular to the third side, and
for at least one or more of the first gas flow component assemblies, the first gas flow component is a valve and the second gas flow component is a mass flow controller.

19. The gas box of claim 8, wherein:
the first gas flow component and the second gas flow component of each of the first gas flow component assemblies are, respectively, a valve and a mass flow controller, And
the mass flow controllers are, at least in part, spaced apart from the third side such that a gap is formed between at least part of each mass flow controller and the third side.

20. The gas box of claim 2, wherein:
the one or more inlet holes have a total open cross-sectional area of X,
the cross-flow holes have a total open cross-sectional area of Y,
the one or more exhaust openings have a total open cross-sectional area of Z, and
any other fluidic flow paths into or out of the gas box, when the door is in the closed state and the gas box is in a normal operational state and other than the one or more inlet holes, the cross-flow holes, and the one or more exhaust openings, have a total open cross-sectional area of less than 20% of X+Y.

\* \* \* \* \*